United States Patent
Witt

(10) Patent No.: US 9,152,743 B2
(45) Date of Patent: Oct. 6, 2015

(54) COMPUTER PROCESS FOR DETERMINING BEST-FITTING MATERIALS FOR CONSTRUCTING ARCHITECTURAL SURFACES

(71) Applicant: Gehry Technologies, Inc., Los Angeles, CA (US)

(72) Inventor: Andrew Witt, Los Angeles, CA (US)

(73) Assignee: GEHRY TECHNOLOGIES, INC., Los Angeles, CA (US)

( * ) Notice: Subject to any disclaimer, the term of this patent is extended or adjusted under 35 U.S.C. 154(b) by 0 days.

(21) Appl. No.: 13/758,944

(22) Filed: Feb. 4, 2013

(65) Prior Publication Data

US 2015/0051875 A1    Feb. 19, 2015

Related U.S. Application Data

(60) Provisional application No. 61/594,339, filed on Feb. 2, 2012.

(51) Int. Cl.
*G06F 17/50* (2006.01)
*E04B 1/00* (2006.01)

(52) U.S. Cl.
CPC ..... *G06F 17/5004* (2013.01); *E04B 2001/0053* (2013.01)

(58) Field of Classification Search
CPC ............ G06F 17/5004; G06F 17/5086; G06F 17/5095; G06F 2217/06; G06F 2217/12; G06F 2217/42; G05B 19/418; G06T 15/00; G06T 15/08; G06T 15/10; G06T 17/00; G06T 17/10; G06T 17/20; G06T 17/30; G06T 19/20; G06T 2210/04
See application file for complete search history.

(56) References Cited

U.S. PATENT DOCUMENTS

| 4,068,422 A | * | 1/1978 | Sumner | 52/81.2 |
| 5,422,987 A | | 6/1995 | Yamada | |
| 5,510,995 A | * | 4/1996 | Oliver | 700/182 |
| 5,619,625 A | | 4/1997 | Konno et al. | |
| 5,880,722 A | | 3/1999 | Brewer et al. | |
| 6,230,116 B1 | | 5/2001 | Ronen et al. | |
| 6,438,494 B1 | | 8/2002 | Yamamoto et al. | |

(Continued)

FOREIGN PATENT DOCUMENTS

| EP | 0770941 | 1/2002 |
| KR | 10-0819960 | 4/2008 |

OTHER PUBLICATIONS van de Straat, Roel, "Parametric Modelling of Architectural Developables", MSc Thesis: Computation & Performance, Delft University of Technology, Faculty of Architecture, Apr. 8, 2011.*

(Continued)

*Primary Examiner* — Mary C Jacob
(74) *Attorney, Agent, or Firm* — Kilpatrick Townsend & Stockton LLP

(57) ABSTRACT

A computer process for fitting construction materials to an architectural surface modeled in CAD divides the surface into domains. Sample points are defined on each domain surface. A surface portion of a regular curved solid is matched to the sample points. The surface portion of the curved solid is defined in terms of a central reference and boundary conditions. The result is compared to stored specifications to identify construction materials capable of forming the domain. At least one construction material is identified that can form each domain.

15 Claims, 12 Drawing Sheets

(56) References Cited

U.S. PATENT DOCUMENTS

| | | |
|---|---|---|
| 7,778,723 B2 | 8/2010 | Cregger |
| 8,112,721 B2 | 2/2012 | Nakamura |
| 8,606,774 B1 | 12/2013 | Makadia et al. |
| 8,648,855 B2 * | 2/2014 | Pedersen ............... 345/423 |
| 8,659,599 B2 * | 2/2014 | Carr et al. ............. 345/423 |
| 8,754,887 B2 | 6/2014 | Kuffner et al. |
| 8,762,856 B2 | 6/2014 | Nykamp |
| 2002/0158905 A1 | 10/2002 | Bazzoni et al. |
| 2004/0113910 A1 * | 6/2004 | Tsai et al. ............. 345/420 |
| 2005/0002571 A1 | 1/2005 | Hiraga et al. |
| 2006/0094951 A1 | 5/2006 | Dean et al. |
| 2007/0136093 A1 | 6/2007 | Rankin et al. |
| 2009/0018808 A1 | 1/2009 | Bronstein et al. |
| 2009/0106674 A1 | 4/2009 | Bray et al. |
| 2010/0004770 A1 * | 1/2010 | Rameau et al. ............ 700/98 |
| 2011/0078801 A1 | 3/2011 | Bae |
| 2011/0146078 A1 * | 6/2011 | Hauptman et al. ......... 29/897.3 |
| 2011/0179723 A1 * | 7/2011 | Jacques ................. 52/80.1 |
| 2013/0235037 A1 | 9/2013 | Baldwin et al. |
| 2013/0271461 A1 | 10/2013 | Baker |

OTHER PUBLICATIONS

Afify et al, "Advanced Digital Manufacturing Techniques (CAM) in Architecture Authors", 3rd Int'l ASCAAD Conference on Embodying Virtual Architecture, 2007.*

Buswell et al, "Freeform Construction: Mega-Scale Rapid Manufacturing for Construction", Automation in Construction, 16, pp. 224-231, 2007.*

Gehry Technologies, "Digital Project V1, R4, Quick Start", May 2009.*

Appelbaum, Alec, "Frank Gehry's Software Keeps Buildings on Budget", The New York Times, Feb. 11, 2009.*

US Non-Final Office Action issued for U.S. Appl. No. 13/717,620 on Nov. 20, 2014.

International Search Report issued on Jun. 26, 2013 for PCT Application No. PCT/US2013/024668.

* cited by examiner (A)

(B)

(C)

(D)

(A)

(B)

(A)

(B)

COMPUTER PROCESS FOR DETERMINING BEST-FITTING MATERIALS FOR CONSTRUCTING ARCHITECTURAL SURFACES

RELATED APPLICATIONS

The present application claims priority to U.S. Provisional Application No. 61/594,339, which was filed on Feb. 2, 2012 and which is fully incorporated herein by reference.

BACKGROUND OF THE INVENTION

1. Field of the Invention

The present invention relates to architectural graphics, and more particularly to a computerized process for determining the best-fitting materials for constructing architectural surfaces, especially curved surfaces.

2. Description of the Related Art

In three-dimensional (3D) modeling, it is often necessary to approximate freeform surfaces with a combination of tiles of regular shapes, such as rectangles, triangles, ovals, and various polygons. When designing, architects often need the freedom to create complexly curved surfaces for structures such as walls and rooftops, without being constrained by regular geometries. Such freeform curves, however, are difficult to realize during construction, because building materials are typically supplied in pieces that have planar surfaces, or curved surfaces that conform to regular cylindrical, spherical, or conical geometries.

Although it is possible to approximate a freeform curve with such geometries, the approximation must be done iteratively through numerical optimization, beginning with an initial best guess, and searching for better-fitting configurations by trial and error.

Currently, one known approach to solving this problem is global optimization, in which a freeform shape is distorted to match a regular shape so that it is more constructible. Another approach is local optimization, which attempts to fit classes of shapes to specific surfaces. These approaches are computationally slow, and tend to sacrifice too much accuracy in arriving at an approximate solution. When applied to very complex curved surfaces, such as those shown in FIG. 1, the shape-fitting problem can be extremely time-consuming and the errors introduced by global and local optimization solutions may not be satisfactory to the architect.

What is needed is a more accurate and computationally efficient process for determining the best-fitting construction materials for realizing freeform curves.

SUMMARY OF THE INVENTION

The present invention provides a computationally efficient and highly accurate computerized process for fitting known construction materials to an architectural surface representation that is stored in a computer-aided design (CAD) file. The invention further improves overall processing speed through parallel processing, which is well-suited for solving material-fitting problems for large architectural projects that include multiple surfaces with complex curvatures.

Generally, the present invention determines best-fitting materials for an architectural surface through a series of process steps carried out on a computer capable of reading the CAD file. Salient steps of one such process include: dividing the surface representation into a plurality of domains, and for each domain in the plurality of domains: (i) defining multiple sample points that lie on a surface of the domain; (ii) matching a surface of a regular curved solid to the multiple sample points; (iii) defining the domain as a surface portion of the regular curved solid in terms of a central reference and boundary conditions; and (iv) comparing the terms of the defined domain to electronically stored specifications for construction materials to identify which construction materials can form the domain. In a final step, at least one construction material is identified that is capable of forming every domain in the plurality of domains.

More specifically, the invention matches the surface of the regular curved solid to the multiple sample points through a two-step process that comprises a low accuracy match and a high accuracy match. The low accuracy match determines type and general orientation for the regular curved solid. The high accuracy match fine-tunes the parameters of the regular curved solid to optimize the fit, including determining surface boundaries for the solid and locating its axis or origin to optimize the fit.

A process of the invention for achieving the low accuracy match improves calculation efficiency by limiting the scope of possible types of regular curved solids, without requiring a high accuracy fit, before proceeding to the more computationally intensive high accuracy match. The low accuracy match includes the following salient steps: locating a test solid at a test orientation with respect to the sample points so that at least two of the sample points coincide with a surface of the test solid, calculating minimum displacements of non-coinciding sample points from the surface of the test solid, and comparing the minimum displacements to a low accuracy tolerance. The process then adjusts, responsive to at least one of the minimum displacements exceeding the tolerance, one or both of the test orientation and the test solid type, and repeats the calculating and comparing steps until a regular curved solid is determined for which none of the minimum displacements are out of the tolerance. The low accuracy match includes a routine wherein, responsive to at least one of the minimum displacements exceeding the tolerance after exhausting all adjustments, the domain is divided into multiple subdomains and the low accuracy matching steps are repeated for each subdomain. This allows for irregularly curved surfaces to be divided into subdomains that can be fit to regular curved solids.

A process of the invention for achieving the high accuracy match uses the sample points of a domain being fit, by deriving from the sample points a central reference for the regular curved solid that was determined by the low accuracy match. Salient steps of the high accuracy match include: (a) selecting multiple triplets from among the multiple sample points, each triplet consisting of any three of the sample points, (b) defining vectors for each triplet, each vector originating from one of the three sample points and extending to another of the three sample points, (c) for every two vectors that have a common origin, calculating a resultant vector as a cross product of the two vectors to yield multiple resultant vectors, (d) for every pair of the resultant vectors, determining a reference point at which the distance between the pair is minimum, thereby determining multiple reference points, and (e) approximating the central reference for the regular curved solid based on the multiple reference points. The central reference may be an axis of a cylinder or cone, or it may be an origin of a sphere. The approximate location of the central reference may be determined using numerical methods such as regression analysis based on the locations of the multiple reference points.

In a more elaborate embodiment, the high accuracy match may further include steps for: (f) defining a test surface from the type of regular curved solid determined by the low accuracy match, wherein the test surface has the axis defined by the high accuracy match and the approximate boundary conditions of the domain, (g) calculating minimum displacements of the sample points from the test surface, and (h) comparing the minimum displacements to a high accuracy tolerance. If at least one of the minimum displacements is out of the tolerance, the process adjusts a geometric parameter of the test surface (such as a radius) to create a new test surface and repeats steps (g) through (i) until all of the minimum displacements are within the tolerance.

When the high accuracy tolerance is satisfied for all minimum displacements, a regular curved solid has been defined that has a surface portion that fits very accurately to the domain of the architectural surface representation. The type of regular curved solid, its central reference, and the boundary conditions comprise a minimal data set required to select a suitable construction material for realizing that portion of the architectural surface. When such data sets have been determined for all domains that make up the architectural surface representation, the construction materials are selected by comparing the data sets to electronically stored specifications for various construction materials to identify the optimal material for forming every domain in the surface representation. According to the invention, the surface representation may be divided into multiple groups of domains for parallel processing using the processes described herein.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals designate like parts throughout the different views, wherein:

FIGS. 5(A) and 5(B) illustrate results of a low accuracy match according to an embodiment of the invention and FIGS. 5(C) and 5(D) illustrate results of a high accuracy match according to an embodiment of the invention.

FIG. 6(A) shows a top perspective view of triplets defined from sample points on a domain of an architectural surface representation. FIG. 6(B) shows a side view of the domain, illustrating convergence of vector cross products near a central reference point.

FIG. 7(A) shows an end view of a top portion of a cylindrical surface, from which vector cross products have yielded reference points that converge about the cylindrical axis. FIG. 7(B) shows a side view of the cylinder, axis, and reference points.

DETAILED DESCRIPTION

Figure 1:
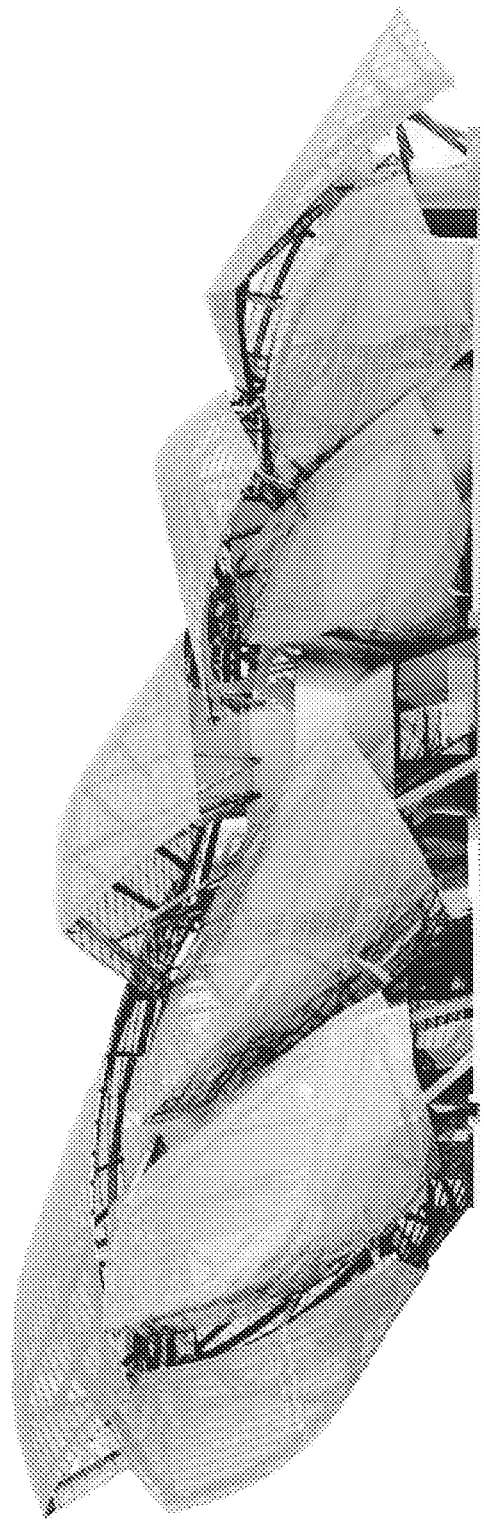
FIG. 1 is a conceptual design for an architectural structure showing multiple complex curved surfaces that present an exemplary fitting problem solvable by a computer process according to the present invention.

In general, the present invention provides technology for converting a complexly curved surface geometry into multiple simple surface geometries to facilitate construction. The methods disclosed herein take into account the formability and tolerances of various types of construction materials when fitting together pieces that compose the design surface. These techniques gives the architect freedom to design structures without being constrained by limitations of regular geometries.

The term "architectural surface representation" as used herein means a design for a structural or ornamental surface of a building, artistic design, architectural design, or edifice. An architectural surface representation may be provided in a sketch, a drawing, a model, or CAD file.

The term "domain" as used herein means an area of a surface. An architectural surface representation may be divided into multiple domains, and each domain has definite boundaries.

The term "regular curved solid" as used herein means a solid that can be defined as a solid of revolution using a continuous function in a two-dimensional Cartesian coordinate system. Examples of types of regular curved solids include cones, cylinders, spheres, and spheroids.

The term "central reference" as used herein means a mathematical property that indicates a central feature of a regular curved solid. Examples of central references include axis, major axis, minor axis, and origin.

The term "boundary condition" as used herein means a perimeter or mathematical limit of the area of a surface or domain. Boundary condition can also include information indicating whether a domain is adjacent to another domain, and the type of the adjacent domain.

The term "construction materials" as used herein means physical materials such as wood, metal, plastic, ceramic, and glass that are used to construct architectural surfaces, particularly curved surfaces constructed from multiple tiles of such materials. Construction material specifications are numerical limitations or ratings that apply to a particular material. Weight, maximum and minimum dimensions, density, elasticity, hardness, and conductivity are examples of such specifications. Herein, construction material specifications of particular interest include formability, i.e., the ability of a given material to undergo deformation without being damaged, and boundary tolerance, i.e., the extent to which the boundary of a tile of material can deviate from a design specification. Boundary tolerance can be a material property, and can also be affected by the sealant specified for use between tiles.

The term "low accuracy match" as used herein means a process, and sometimes an iterative process, for matching a surface of a test solid to a domain of an architectural surface representation, using a relatively less restrictive tolerance for acceptance.

The term "high accuracy match" as used herein means a process, and sometimes an iterative process, for matching a test surface to a domain of an architectural surface representation, using a relatively highly restrictive tolerance for acceptance as compared to the tolerance of the low accuracy match.

The term "non-coinciding sample point" as used herein means any sample point on the surface of a domain that does not also lie on a test surface during a comparison of the test surface to the domain. The determination whether the sample point lies on the test surface is subject to a reasonable mathematical tolerance, as determined by the designer.

The terms "low accuracy tolerance" and "high accuracy tolerance" are relative dimensional terms with respect to each other, with actual values to be determined by the designer, under the constraint that the high accuracy tolerance express a more restrictive tolerance than the low accuracy tolerance.

The term "subdomain" as used herein means an area of a surface representation that is a subdivision of a domain. Usually, a domain will be divided into two or more subdomains as a result of the inability of a low accuracy match or high accuracy match to define a regular curved solid having a surface portion that matches the domain under test within a desired tolerance.

The term "triplet" as used herein denotes a group of three sample points.

The term "common origin" as used herein denotes one of the three sample points of a triplet that is an end point for both of two vectors that extend from the one sample point to another of the three sample points.

The term "reference point" as used herein denotes a point at which two resultant vectors are closest in space.

The term "resultant vector" is the vector that results from a cross product operation on two vectors that share a common origin, the resultant vector pointing in a direction orthogonal to the plane defined by the two vectors being multiplied.

The term "geometric parameter" as disclosed herein means a numerical value or property of a curved solid, such as a radius, length, arc length, diameter, etc.

FIG. 1 shows a conceptual design for an elaborate architectural structure 100. At a glance, and without having to describe the structural surfaces in any great detail, it is apparent to the observer that this particular design poses a formidable problem to the construction company tasked with realizing the design in physical form. The design includes multiple complex curved surfaces that are irregular in form, i.e. the curves do not appear to conform to any regular geometric patterns that can be easily defined in terms of spherical, cylindrical, or conical surfaces. Practically speaking, such surfaces must be constructed from a series of smaller tiles that are connected together in such a way that the desired surface formations are achieved in aggregate. Determining the proper sizes and materials for the tiles, however, is a problem that does not lend itself to a solution brought about by manual calculations or manual trial and error. Modern computer processes are required to optimize problem-solving. The architectural surface representations of FIG. 1, therefore, present an exemplary fitting problem solvable by a computer process according to the present invention. Thus, the methods disclosed herein require an enormous amount of mathematical calculations, cannot be reasonably or practically accomplished by hand, and are specifically designed to be carried out by means of computer systems.

Accordingly, processes and systems of the inventions disclosed herein may be practiced using general purpose computers that are converted into specialized computer systems when programmed with software described by the inventive processes herein. The software programs themselves may be written using known programming languages, and skilled code writers will understand that there are many ways to write such code to achieve the requirements of the software processes of the present invention. Therefore, fundamentals of computer systems and computer programming codes which are necessary for carrying out the invention will not be further described as such knowledge is already within the grasp of the relevant class of skilled artisans.

Figure 2:
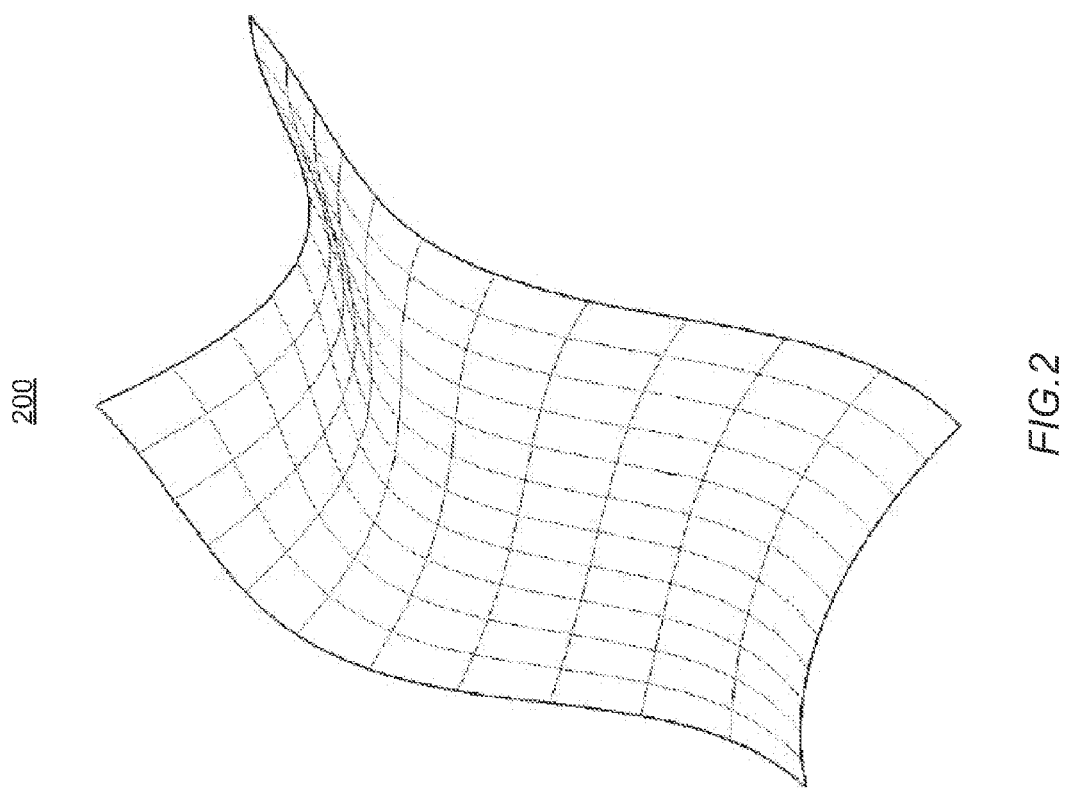
FIG. 2 is a perspective view of a complexly curved architectural surface representation for which construction materials may be determined according to the present invention. The surface representation has been divided into multiple domains according to one embodiment of the invention.

FIG. 2 is a perspective view of a complexly curved architectural surface representation 200, for which construction materials may be determined according to the present invention. Surface representation 200 may be part of the complex structure 100, or it may be an arbitrary irregularly curved surface for which construction materials are to be selected. As shown in the figure, the surface representation 200 has been divided into multiple domains according to a process step in one embodiment of the invention.

The multiple domains of surface representation 200 are shown as a grid-like overlay comprising multiple intersecting lines that divide the surface into domains that are roughly equivalent in area. According to the invention, the pattern of domains that result from dividing the surface representation into a plurality of domains has no special significance. The domains can be generally rectangular, as shown, or may be generally triangular, hexagonal, or may be composed of any combination of such shapes, in a regular or an irregular distribution. What is important is that the surface representation be divided into a plurality of domains. Preferably, the pattern of division, and the means for defining that pattern within the boundaries of the surface representation, are selected to improve the probability that the resulting domains can be matched to within a desired tolerance to a portion of a surface of a regular curved solid. Generally, this may be achieved by defining domains using shapes that approximate regular geometric shapes, and by defining the size of the domain to be relatively small in relation to the are of the surface representation being divided. The use of more regular geometric shapes for the domains may facilitate mathematical expressions and calculations that will be needed later on, for example, when defining the boundaries of a regular curved solid being fit to the domain.

Figure 3:
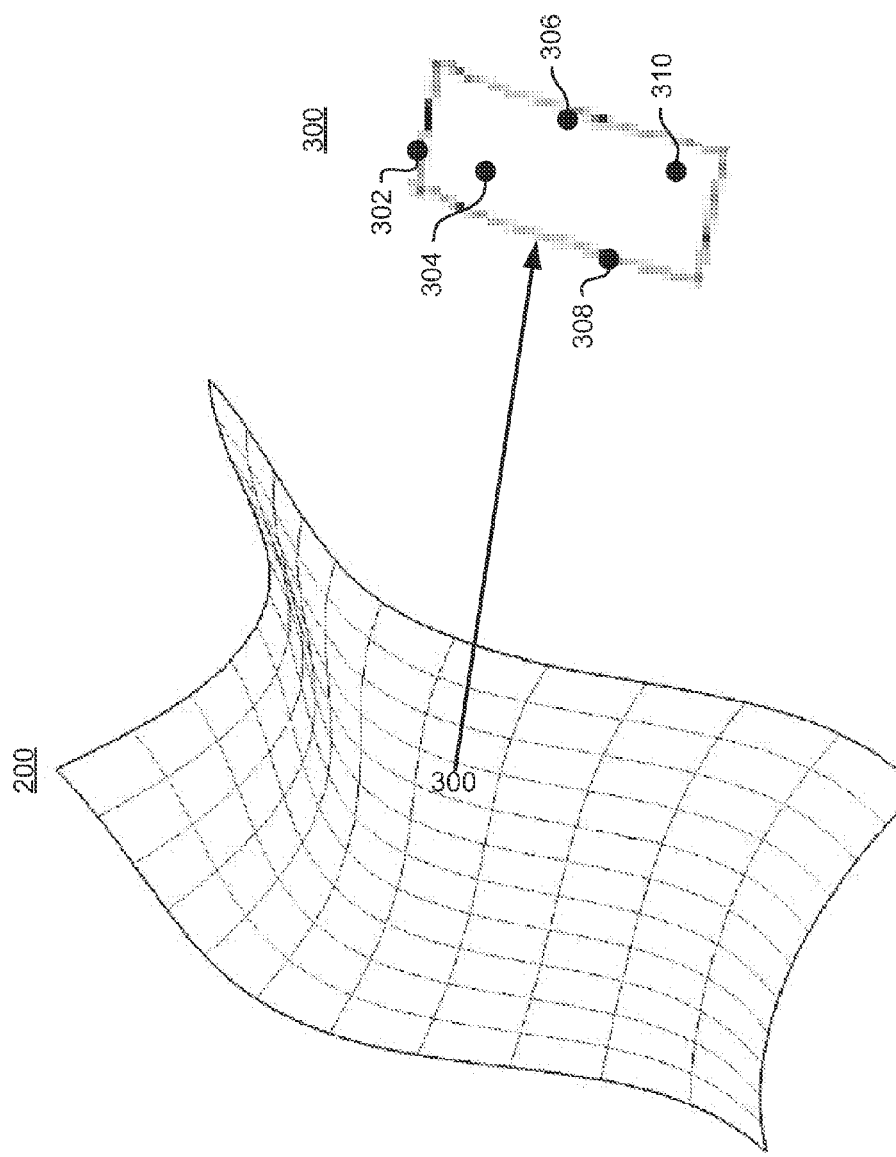
FIG. 3 shows the surface representation of FIG. 2, along with a magnified top view of a particular domain of the surface representation and multiple sample points that have been defined on the domain in accordance with an embodiment of the invention.

FIG. 3 shows the surface representation 200, along with a magnified top view of a particular domain 300 of the surface representation 200. Multiple sample points 302, 304, 306, 308, and 310 that have been defined on the domain in accordance with a process step of an embodiment of the invention.

Five sample points have been defined only for purposes of illustration. In practice, it may be desirable to define a much greater number of sample points to improve the accuracy of subsequent fitting calculations. As the number of sample points increases, however, the number of possible calculations described herein and based on the sample points can increase exponentially, and therefore practical limitations should be placed on the maximum number of sample points for purposes of preserving the objective achieving a high processing speed. In one embodiment, a minimum of four sample points should be defined, so that more than one triplet can be selected from among the sample points. In another embodiment, a maximum limitation, such as ten sample points, is set when performing this step.

The location of each sample point may be determined in any of various ways within the scope of the invention. One method is to determine the locations randomly. Another method is to pre-determine the locations according to a pattern or template. Another method is a combination of these methods, wherein a template defines X number of possible locations for Y sample points (Y<X), and the final locations are determined by random number generation from among the X locations. Another method is to require that minimum or maximum numbers of the sample points must occur on a boundary of the domain, or within the interior of a domain. For example, sample points 302, 306, and 308 each occur on a boundary of domain 300, while sample points 304 and 310 each occur on the interior of the domain 300. Another method is to establish a rule whereby a sample point cannot be located within a certain distance from any other sample point, so that a more even distribution of points is achieved. Skilled artisans, creative thinkers, and computer programmers will realize that there are many ways to establish rules for locating multiple sample points within a domain. Any such rule will satisfy the general requirement of this process step.

It should be understood that defining the domains, locating the sample points, and performing other steps described in the context of this invention may be achieved by writing software code so that the resulting program, when executed, causes electronic storage of information representing mathematical relationships that can be retrieved to evidence such concepts as the area of a domain, its location within an architectural surface representation, the number and location of sample points within the domain, etc. For example, the evidence may be made apparent by displaying the results on a computer terminal or printing the results on paper.

Figure 4:
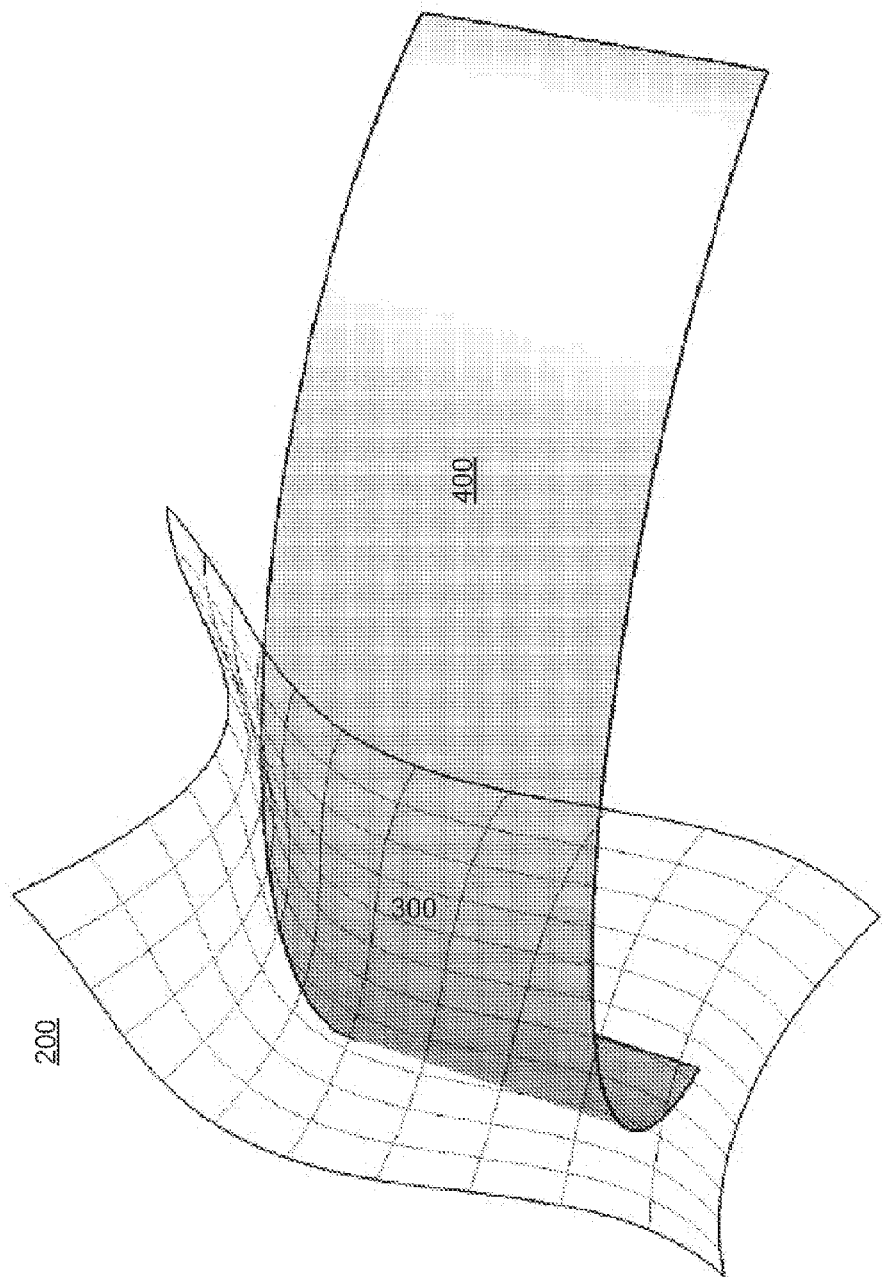
FIG. 4 is a conceptual diagram showing in perspective view a surface of a regular curved solid being matched to a domain of the architectural surface representation of FIG. 2.

FIG. 4 is a conceptual diagram showing, in perspective view, a surface of a regular curved solid 400 being matched to a domain 300 of the architectural surface representation 200. This conceptual diagram illustrates an objective of the invention, to wit, dividing a complexly curved surface representation into a plurality of domains, and for each domain, matching a surface of a regular curved solid to each domain. In this instance, analysis of the sample points of domain 300 has determined that the curvature of domain 300 resembles the curvature of a class of regular curved solids known as cylinders.

The objective now is to determine the geometric parameters of a cylinder 400 that best match, or represent, domain 300. In other words, as indicated in the figure, the process of the invention seeks to define a cylinder 400 that has a surface portion that matches the form of domain 300 to within an acceptable tolerance. The parameters or dimensions of the surface portion can then be compared to electronically stored specifications of known construction materials to determine one or more possible materials that can form the domain. In this fashion, when materials have been identified for all domains within the surface representation, the invention may identify at least one material that can form all of the domains and thereby solve the fitting problem.

Figure 5:
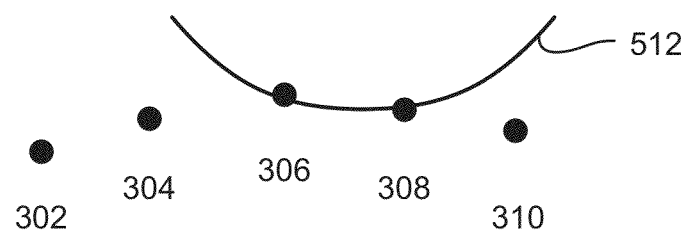
FIG. 5 shows a series of geometric diagrams to illustrate an iterative process according to one embodiment of the invention for fitting a regular curved solid to sample points taken from a domain of an architectural surface representation.
Figure 5:
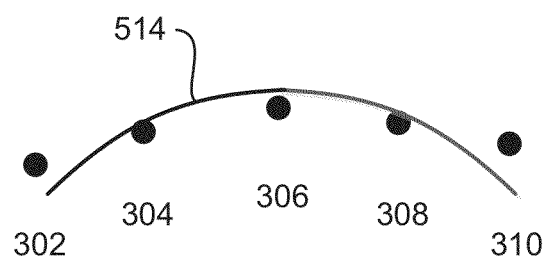
Figure 5:
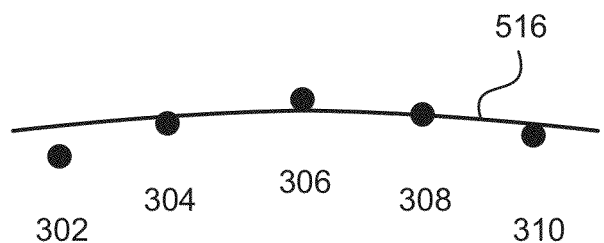
Figure 5:
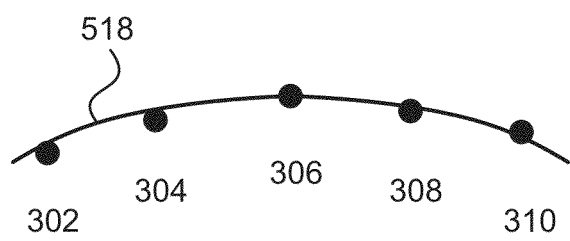

FIG. 5 shows a series of geometric diagrams to illustrate an iterative process according to one embodiment of the invention for fitting a regular curved solid to sample points taken from a domain of an architectural surface representation. FIGS. 5(A) and 5(B) illustrate results of a low accuracy match according to an embodiment of the invention. FIGS. 5(C) and 5(D) illustrate results of a high accuracy match according to an embodiment of the invention.

FIG. 5(A) represents the result of an initial or early attempt in the fitting process. Sample points 302, 304, 306, 308, and 310 are shown in a side view, with respect to the top view of the same points that is shown in FIG. 3. The distribution of the sample points as seen in the side view shows an outline of a smooth arc, which suggests that domain 300 could be matched to the surface of a particular type of regular curved solid such as a cylinder, cone, or sphere.

In a step of the process for determining a low accuracy match, an attempt is made to find a rough estimate of the type of solid that is the best match, as well as the general orientation of the solid. To speed up the processing time required to complete this step, a relatively low tolerance of acceptance is selected. This advantageously allows the process to quickly rule out many classes of possible solids before advancing to a more processing-intensive high accuracy matching step.

There are many ways to estimate a type and orientation of a regular curved solid that matches the distribution of sample points to a low accuracy. In one such method, a test solid is selected, randomly or otherwise, from a class of test solids. The test solid is located, using algorithms stored in software according to the invention, so that at least two of the sample points defined for the domain under test coincide with a surface of the test solid. An initial result of this locating step is depicted in FIG. 5A, which shows test solid 512 oriented in such a way that its surface intersects the two points 306 and 308. Then, the minimum displacements of non-coinciding sample points from the test solid 512 are calculated, and these displacements are compared to the selected low accuracy tolerance or threshold. In this example, sample points 302, 304, and 310 are non-coinciding points because they do not lie on the surface of test solid 512.

Specific numerical results of the comparisons of the displacements of sample points 302, 304, and 310 are not necessary for an understanding of this step. One can see at a glance that the orientation of test solid 512 is not a good match to the distribution of sample points. In a situation such as this, the displacements of points 302, 304, and 310 are beyond the low accuracy tolerance. Skilled artisans will immediately recognize that the selection of the tolerance value need not be too restrictive to quickly enable the software to rule out various test solid types and orientations. As a type and orientation is ruled out, the process selects another combination of test solid and orientation for the next trial. In one implementation, the same type of test solid may be tried in a different orientation. In another implementation, the type of test solid is changed and tried in an appropriate orientation. In other words, the process adjusts, responsive to one or more of the minimum displacements exceeding the tolerance, one or both of the test orientation and test solid type.

This process of calculating and comparing is repeated iteratively until a regular curved solid is determined for which none of the minimum displacements are out of tolerance. Such a case is depicted in FIG. 5(B), in which test solid 514, a cylinder, in its orientation with respect to the sample points meets the acceptance criteria. Here, points 304 and 308 coincide with the test surface, and the displacements of non-coinciding points 302, 306, and 310 are each within the low accuracy tolerance. Thus, at the conclusion of the low accuracy match, the type of test solid and its general orientation are known.

FIG. 5(C) depicts an early step in a process for achieving a high accuracy match. A technique according to the invention for calculating a high accuracy match is described in greater detail below. Generally, the high accuracy match exploits the results of the low accuracy match to fine-tune the geometric parameters of the test solid until a solution is found that satisfies a high accuracy tolerance. In FIG. 5(C), the location of the axis (not shown) of the cylinder 514 has been derived from the sample points, and the radius of the cylinder has been adjusted to alter the curvature of the surface in an attempt to find a better match. The result is a new test solid 516, also a cylinder, but having a different (in this case flatter) surface curvature as shown.

FIG. 5(D) depicts a final result of the high accuracy match. At this stage of the process, a test solid 518 has been found that has a surface portion that matches the distribution of sample points to within the selected high accuracy tolerance. That is, the displacements of all sample points from the surface portion lie within the tolerance value. Knowing the type of regular curved solid, the location of its central reference, and other parameters such as its radius, provide a set of information that can be compared to electronically stored material specifications to identify which known construction materials are capable of forming the domain.

Figure 6:
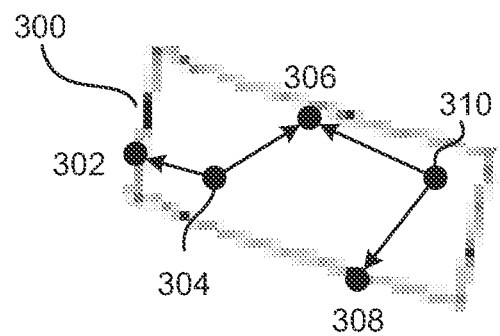
FIG. 6 shows geometric diagrams that illustrate steps of a high accuracy match according to an embodiment of the invention.
Figure 6:
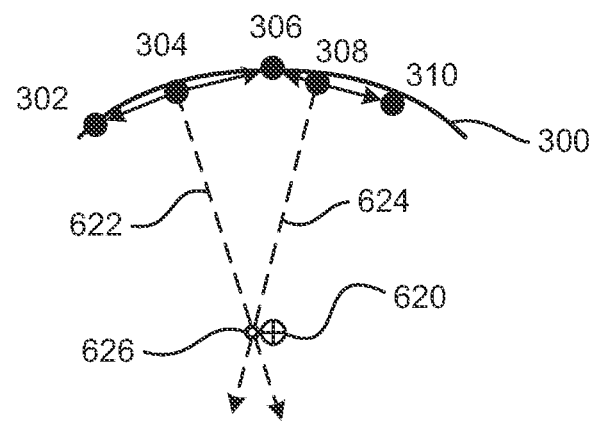

FIG. 6 shows geometric diagrams that illustrate, in greater detail, steps of a high accuracy match according to an embodiment of the invention. FIG. 6(A) shows a top perspective view of triplets defined from sample points 302, 304, 306, 308, and 310 on a domain 300 of an architectural surface representation. The triplets are defined in an initial step of the high accuracy match process. Software according to the invention is programmed to select any three points from among the plurality of sample points to form a triplet. Any algorithm that achieves this requirements will suffice, and many different algorithms are possible, such as one that determines triplets randomly, or according to proximity, or according to angles formed, etc. At least one triplet must be selected; however, multiple triplets should be selected to improve the accuracy of the process, but too many triplets will unnecessarily burden processing time. In FIG. 6(A), only two triplets are shown to facilitate the example. Here, a first triplet is selected as comprising points 302, 304, 306, and a second triplet is selected as comprising points 306, 308, 310.

Once the triplets are selected, vectors are defined from each triplet. Each vector must originate from one of the triplet points and extend to another one of the triplet points. Here, for the first triplet, point 304 serves as a common origin for the vector extending to 302 and for the vector extending to 306. Similarly, for the second triplet, common origin 310 serves for a vector extending to 306 and for a vector extending to 308. Thus, for any triplet, three different vector pairs may be defined. A process of the invention need not define all such vectors for every triplet. Preferably, however, multiple vector pairs are defined at the conclusion of this step.

Then, for every two vectors that have a common origin, the process calculates a resultant vector as the cross product of the two vectors. Applying this step to multiple vector pairs yields multiple resultant vectors. Mathematicians will recognize that the resultant vector of each cross product operation will point in a direction orthogonal to the plane defined by the two operand vectors. The resultant vectors for this example are illustrated FIG. 6(B), which shows a side view of the domain 300. Resultant vector 622 is the result of a cross product of vector 304-302 and vector 304-306. Resultant vector 624 is the result of a cross product of vector 308-306 with vector 308-310. Resultant vectors 622 and 624 may form a pair of resultant vectors.

The process then calculates, for every pair of resultant vectors, a reference point 626 at which the distance between the pair is minimum. Techniques for finding the closest point between two lines extending into three-dimensional space are well known and therefore not discussed herein in greater detail. However, to ensure that the desired reference point is found, the process for calculating the reference point may first extend the lengths of the resultant vectors by a scaling factor to ensure that the reference point is the same point that would be found if the resultant vectors were of infinite length.

Those skilled in geometry and vector mathematics will recognize that, for a surface such as domain 300 that has a curvature similar but not equivalent to that of a theoretical cylindrical surface, the reference point 626 will occur near to the axis 620 of the theoretical cylinder. Carrying this example further, if multiple such reference points are determined based on comparisons of multiple resultant vector pairs, the multiple reference points will converge about a central reference point such as axis 620.

Figure 7:
FIG. 7 shows geometric diagrams that illustrate the distribution of multiple reference points derived from pairs of vector cross products.
Figure 7:
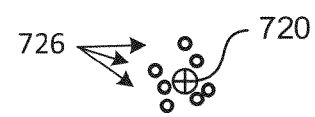
Figure 7:
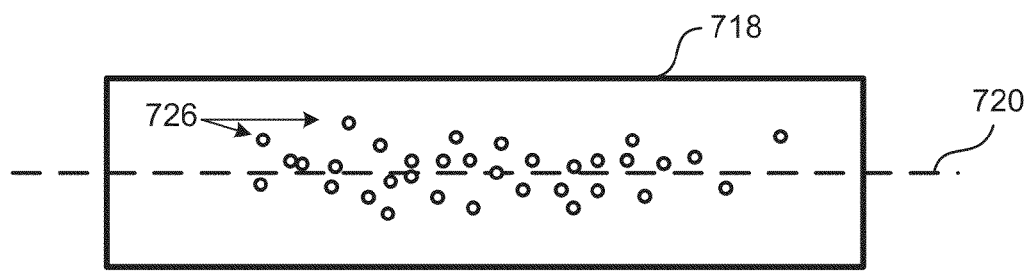

This situation is depicted in FIG. 7, which shows the distribution of multiple reference points derived from pairs of vector cross products. FIG. 7(A) shows an end view of a top portion of a test surface, i.e. cylindrical surface 718, from which vector cross products have yielded reference points 726 that converge about the cylindrical axis 720. FIG. 7(B) shows a side view of the test cylinder, axis, and reference points.

To obtain the multiple reference points, any two resultant vectors may be compared, and these need not be two resultant vectors generated from vectors of the same triplet. The particular selections of triplets, definitions of vectors from triplets, and choices of resultant vectors for comparison can vary widely without departing from the scope of the invention. To ensure a higher probability of accuracy, however, triplets should be chosen from among sample points that are neither too distant from, nor too close to one another. Triplet points that are too distant will not accurately represent the curvature of the domain. Triplet points that are too close may introduce anomalies, for example, if they occur upon or within a sharp recess of the domain.

When a desired number of reference points have been determined, the central reference 620 or 720 is approximated using a suitable numerical method. For example, well known techniques for regression analysis may be employed to fit a straight line to the distribution of reference points shown in FIG. 7(B). The result of the approximation is therefore an equation for a line defining the axis 720 of the cylinder having surface 718. In the case of a spherical test solid, the reference points would converge about the origin of the sphere and regression analysis would define a location of the origin. Whether an equation for a line, or a location of a point, the results may be expressed in the context of a local coordinate system that maps to the coordinate system of the CAD file from which the architectural surface representation was selected.

With reference again to FIG. 5, the process of the high accuracy match may operate iteratively, until an acceptable fitting is achieved as depicted in FIG. 5(D). For example, in one implementation, after approximating the central reference using sample points from the domain, the high accuracy match defines a test surface from the type of regular curved solid that was determined by the low accuracy match, having the central reference defined by the high accuracy match and having boundary conditions approximately coincidental with those of the domain. The test surface is then superimposed on, or otherwise plotted along with the domain under test. Minimum displacements of the sample points from the test surface can then be calculated and compared to the predetermined high accuracy tolerance. If at least one of the minimum displacements is out of tolerance, the process adjusts a geometric parameter of the test surface to effect a slight change in the curvature of the test surface, and repeats the tolerance test using the new test surface. This process continues until all minimum displacements are within tolerance. Limitations may be placed on the maximum number of iterations for trial, and if the limit is reached without a solution, corrective action can be taken, such as dividing the domain under test into multiple subdomains and repeating the process beginning with the low accuracy test.

Figure 8:
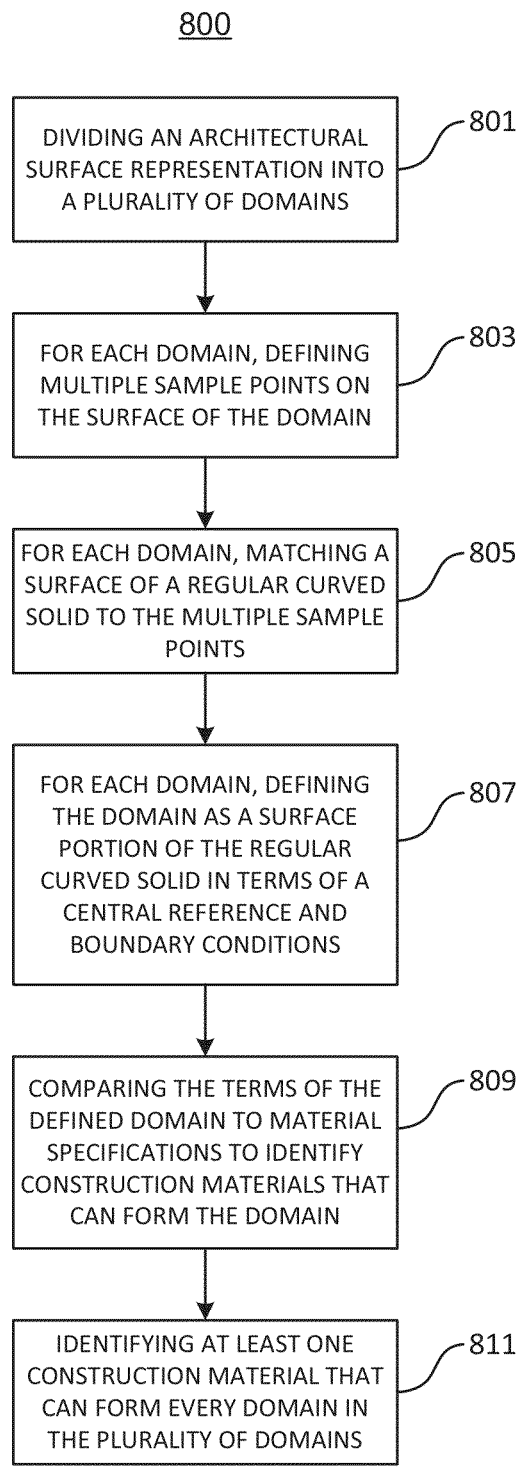
FIG. 8 is a flow chart illustrating one embodiment of a process according to the invention for fitting construction materials to an architectural surface representation.

FIG. 8 is a process flow chart illustrating one embodiment of a process 800 according to the invention for fitting construction materials to an architectural surface representation. Process 800 presents a series of salient steps for practicing one version of the invention as heretofore described. In view of the foregoing discussions, one skilled in the art should understand that the steps of process 800 compose a concise software requirements specification for enabling realization of the invention as computer-executable software.

Process 800 begins at step 801, which requires dividing an architectural surface representation into a plurality of domains. Next, step 803 requires defining, for each domain, multiple sample points on the surface of the domain. Next, step 805 requires matching, for each domain, a surface of a regular curved solid to the multiple sample points. Next, step 807 requires for each domain, defining the domain as a surface portion of the regular curved solid in terms of a central reference and boundary conditions. Next, step 809 requires comparing the terms of the defined domain to material specifications to identify construction materials that can form the domain. The final step 811 requires identifying at least one construction material that can form every domain in the plurality of domains.

Note that in step 807, the boundary conditions place limits on the surface area of the regular curved solid that is being matched to the domain under test. In one embodiment, these boundary conditions are approximately the same as the boundary conditions of the domain under test, and may be defined by any suitable mathematical algorithm that superimposes the perimeter of the domain under test onto the regular curved solid.

Note that in step 809, the material specifications may be stored in memory accessible to the computer executing the process 800. Generally, the materials being considered during this step are sheet materials that are capable of being formed or curved to a certain degree. Various metals, woods, glasses, and ceramics are examples of materials that can be formed with some degree of curvature according to the surface of a regular curved solid, either through casting, molding, bending, machining, warping, or through some other forming process. The material specifications place limits on the thickness and degree of curvature for each material that are required to achieve a given material property such as strength or elasticity. The material specifications may also provide boundary tolerances that take into account the different sealants that can be used to join together two tiles at their boundaries. Gaskets, mortar, weather stripping, and silicon sealants are some examples. For example, a comparison of defined domain to material specifications may determine that, for a surface tile defined as a cylindrical curve having a radius of 6 inches and boundary conditions of 4 inches in length and 30 degrees of arc length, one possible solution is a ¼ inch thick heat-strengthened laminated glass and conventional weather stripping.

Figure 9:
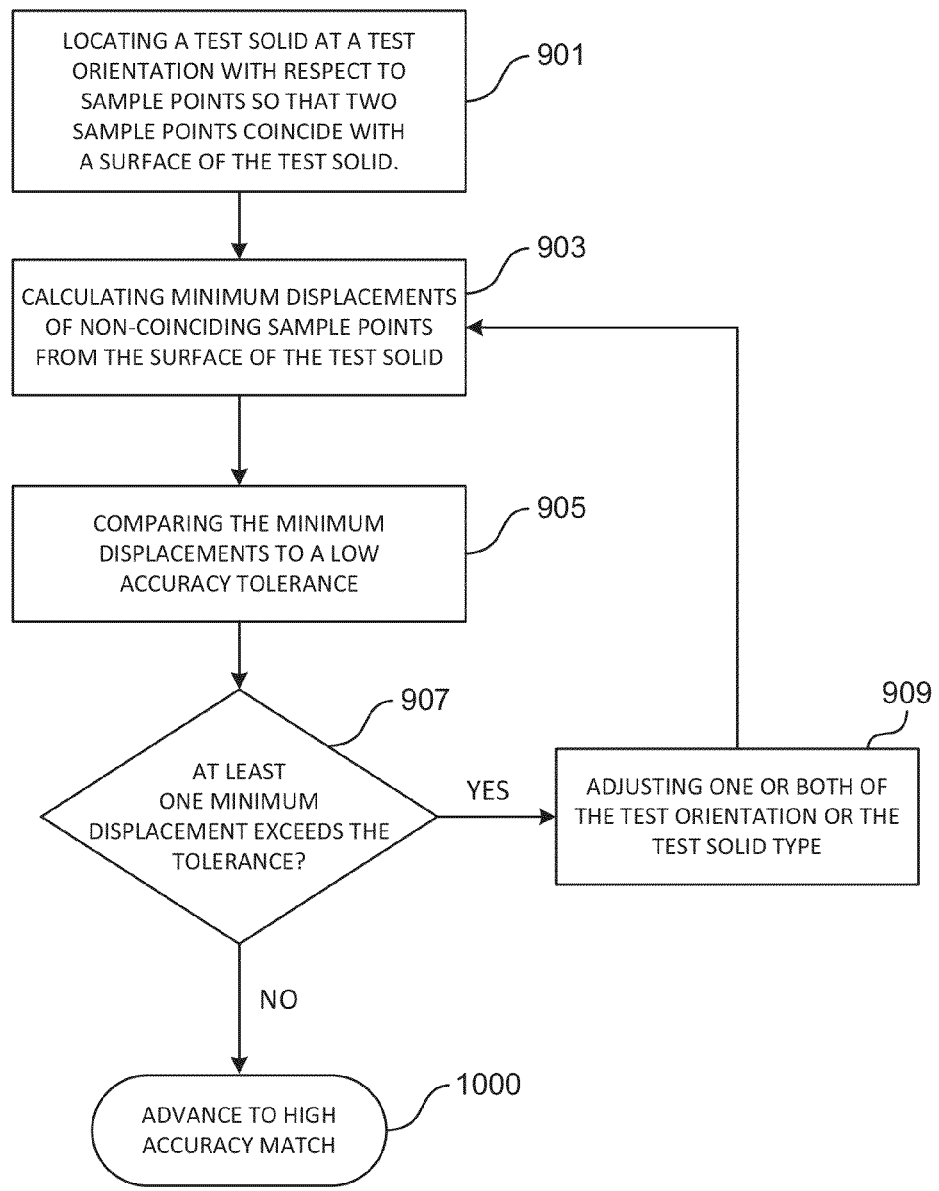
FIG. 9 is a flow chart illustrating an embodiment of a process according to the invention for fitting construction materials to an architectural surface representation using a low accuracy matching technique.

FIG. 9 is a flow chart illustrating an embodiment of a process 900 according to the invention for fitting construction materials to an architectural surface representation using a low accuracy matching technique. Process 900 presents a series of salient steps for practicing one version of the invention as heretofore described, and may be employed in combination with other processes disclosed herein. As in the case of process 800, one skilled in the art should understand that the steps of process 900 compose a concise software requirements specification for enabling realization of the invention as computer-executable software.

Process 900 may be executed within step 805 of process 800. Process 900 begins at step 901, which requires locating a test solid at a test orientation with respect to sample points so that at least two sample points coincide with a surface of the test surface. Next, step 903 requires calculating minimum displacements of non-coinciding sample points from the surface of the test solid. Next, step 905 requires comparing the minimum displacements to a low accuracy threshold. At the next step 907, it is determined based on the comparisons made in step 905 whether at least one minimum displacement exceeds the low accuracy tolerance. If so, the process proceeds to step 909, which requires adjusting one or both of the test orientation or the test solid type. The process then loops back to step 903. If, however, all minimum displacements are within the low accuracy tolerance, then the process ends, or optionally advances to process 1000, which is the high accuracy match, or optionally advances to step 807 of process 800.

Figure 10:
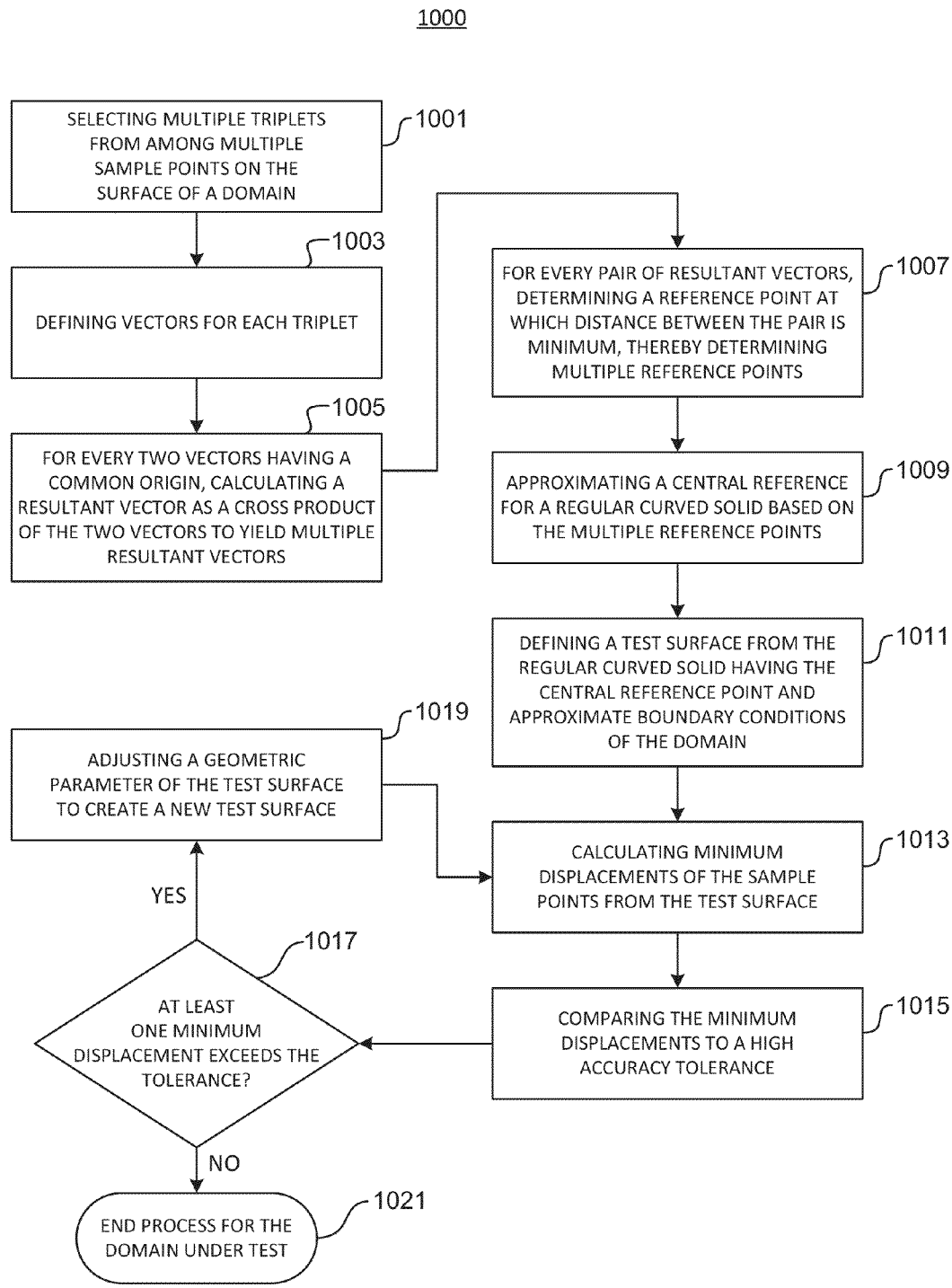
FIG. 10 is a flow chart illustrating an embodiment of a process according to the invention for fitting construction materials to an architectural surface representation using a high accuracy matching technique.

FIG. 10 is a flow chart illustrating an embodiment of a process 1000 according to the invention for fitting construction materials to an architectural surface representation using a high accuracy matching technique. Process 1000 presents a series of salient steps for practicing one version of the invention as heretofore described, and may be employed in combination with other processes disclosed herein. As in the case of process 800, one skilled in the art should understand that the steps of process 1000 compose a concise software requirements specification for enabling realization of the invention as computer-executable software.

Process 1000 may be executed within step 805 of process 800. Process 1000 begins at step 1001, which requires selecting multiple triplets from among multiple sample points on the surface of a domain. Next, step 1003 requires defining vectors for each triplet. Next, step 1005 requires, for every two vectors having a common origin, calculating a resultant vector as a cross product of the two vectors to yield multiple resultant vectors. Next, step 1007 requires, for every pair of resultant vectors, determining a reference point at which distance between the pair is minimum, thereby determining multiple reference points. Next, step 1009 requires approximating a central reference for a regular curved solid based on the multiple reference points. Next, step 1011 requires defining a test surface from the regular curved solid having the central reference point and approximate boundary conditions of the domain. Next, step 1013 requires calculating minimum displacements of the sample points from the test surface. Next, step 1015 requires comparing the minimum displacements to a high accuracy tolerance. At the next step 1017, it is determined based on the comparisons made in step 1015 whether at least one minimum displacement exceeds the high accuracy tolerance. If so, the process proceeds to step 1019, which requires adjusting a geometric parameter of the test surface to create a new test surface. The process then loops back to step 1013. If, however, all minimum displacements are within the high accuracy tolerance, then the process ends at step 1021, or optionally advances to process step 807 of process 800.

Figure 11:
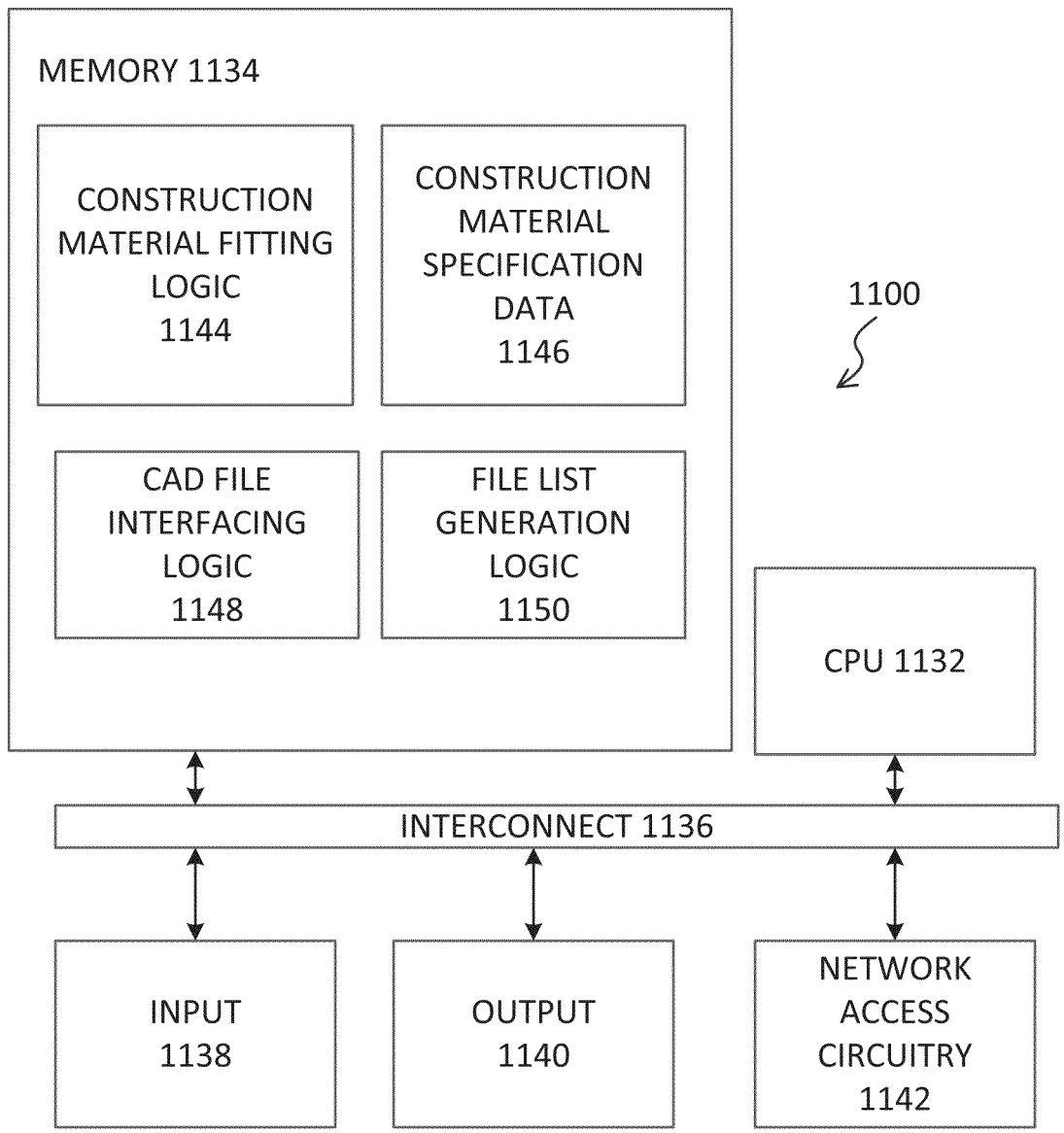
FIG. 11 is a block diagram illustrating functional modules of a specialized computer that includes software for determining best-fitting materials for constructing curved architectural surfaces according to an embodiment of a system of the present invention.

FIG. 11 is a block diagram illustrating functional modules of a specialized computer that includes software for determining best-fitting materials for constructing curved architectural surfaces according to an embodiment of a system 1100 of the present invention.

The computer system 1100 can include, for example, one or more microprocessors, which are collectively shown as CPU 1132. The system 1100 also includes, for example, a memory module 1134, an interconnect module 1136, an input module 1138, an output module 1140, and optional network access circuitry 1142. The CPU 1132 can retrieve data or instructions from the memory 1134 and execute the retrieved instructions. The memory 1134 can include generally any computer-readable medium including, for example, persistent memory such as magnetic and/or optical disks, ROM, and PROM and volatile memory such as RAM.

The CPU 1132 and the memory 1134 are connected to one another through the interconnect 1136, which is a bus in this illustrative embodiment. The interconnect 1136 connects the CPU 1132 and the memory 1134 to input devices 1138, output devices 1140, and network access circuitry 1142. The input devices 1138 are also optional, and may include, for example, a keyboard, a keypad, a touch-sensitive screen, a mouse, a microphone, and one or more cameras. The output devices 1140 are also optional and may include, for example, a display—such as a liquid crystal display (LCD)—and one or more loudspeakers. The network access circuitry 1142 sends and receives data through computer networks, for example, to receive or access CAD drawings or construction material specifications.

A number of components of the system 1100 are stored in the memory 1134. In particular, construction material fitting logic 1144 is part of one or more computer processes executed within the CPU 1132 from the memory 1134 in this illustrative embodiment, but can also be implemented using digital logic circuitry. The construction material fitting logic may be executable code embodying one or more processes of the invention as described herein. Likewise the CAD file interfacing logic 1148, the file list generation logic 1150, execute within the CPU 1132 from the memory 1134, and may also be implemented in digital logic circuitry. CAD file interfacing logic may function to read architectural surface representations that are stored in CAD files, to establish coordinates for dividing surface representations into domains, establish proper scaling for domains, etc. Construction material specification data may store information on construction materials for use in comparing the results of the fitting processes to known materials that are capable of forming domains. File list generation logic may generate results of the processes, such as bills of material for realizing an architectural surface representation, to identify one or more construction materials that can form every domain into which an architectural surface representation has been divided according to the invention.

Figure 12:
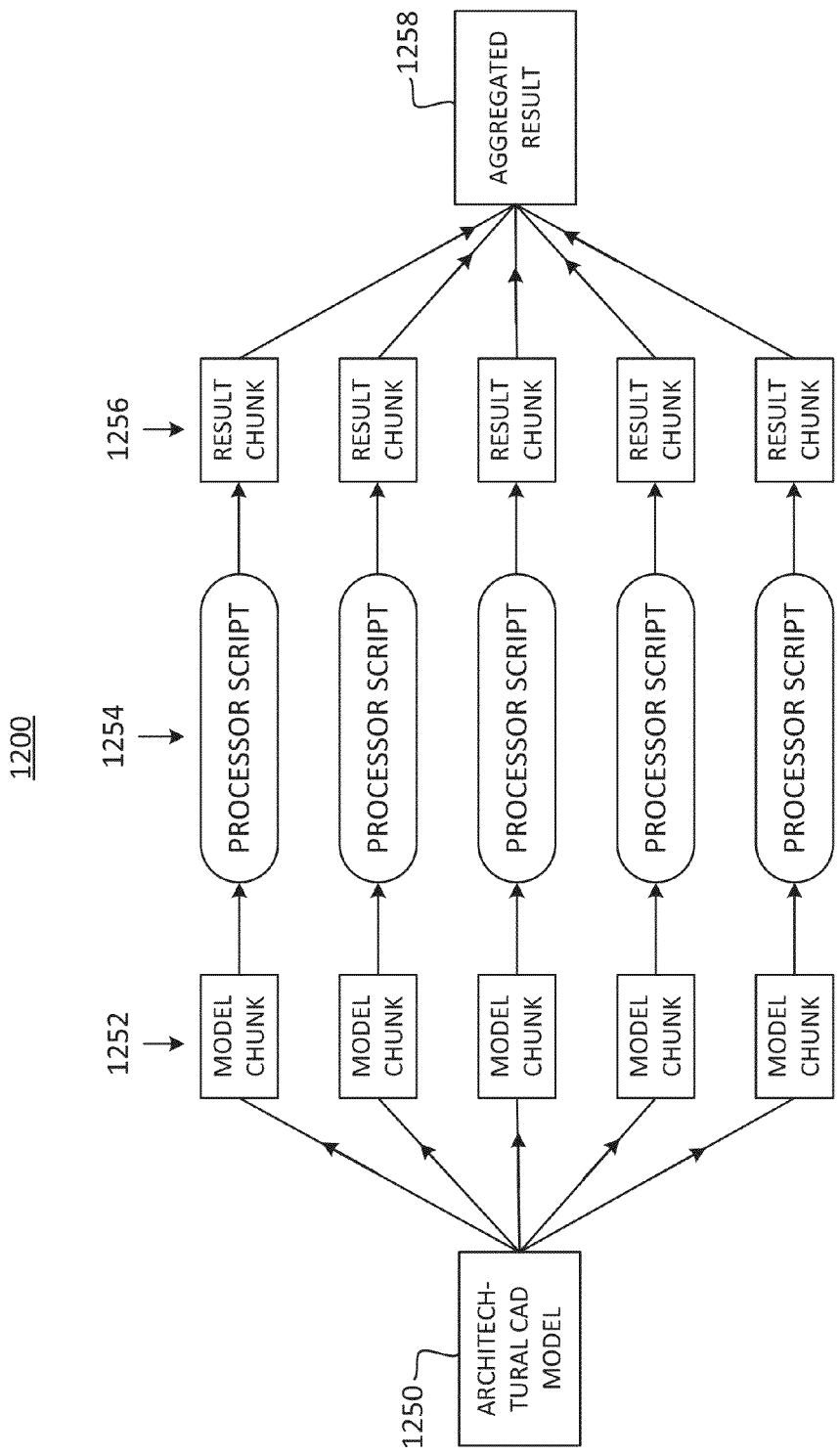
FIG. 12 is a block diagram illustrating an embodiment of a parallel processing scheme for fitting construction materials to an architectural surface representation according to one embodiment of the invention.

FIG. 12 is a block diagram illustrating an embodiment of a parallel processing scheme 1200 for fitting construction materials to an architectural surface representation according to one embodiment of the invention. Scheme 1200 is especially useful for architectural projects such as shown in FIG. 1 that require material-fitting solutions for complexly curved surfaces covering very large areas. In cases such as this, enhanced computer processing power is required to arrive at solutions in a timely manner.

Scheme 1200 illustrates, conceptually, how parallel processing may be employed to manage processes according to the invention more quickly. An architectural CAD model 1250 describes many complexly curved surfaces. A manager script (not shown) running in the CAD software or elsewhere in a system such as 1100 decides how to split the various surfaces within model 1250 into independent chunks for processing. For example, the model may be divided into multiple complexly curved surfaces that are roughly equivalent to one another in area. The manager script further decide how many model chunks 1252 to define from the multiple complexly curved surfaces. The manager script then decides how many CPUs to run concurrently for processing each model chunk 1252 according to the fitting processes of the present invention as previously described.

Each model chunk 1252 is then assigned to a dedicated CPU, and the CPUs run processing scripts in parallel. The processing scripts 1254 execute the fitting processes on each respective model chunk until a fitting solution is achieved. The solutions are output from each respective processing script 1254 as a result chunk 1256. The result chunks 1256 are then returned to the manager script and aggregated to form a complete fitting solution 1258 for the model 1250. The manager script may create from the aggregated result a graphical overlay to superimpose on the original CAD model. The overlay may be color-coded or otherwise annotated to indicate the various types and sizes of construction materials that compose the aggregated result.

As described herein, the terms "component", "module", "system", "computer" and the like each refer to a computer-related entity, either hardware, firmware, a combination of hardware and software, software, or software in execution. For example, a module can be, but is not limited to being, a process running on a processor, a processor, an object, an executable, a script, a thread of execution, a program, or a computer. By way of illustration, both an application running on a computing device and the computing device itself may comprise a module. One or more modules can reside within a process or thread of execution and a module can be localized on one computer or distributed between two or more computers. In addition, these modules can execute from various computer readable media having various data structures stored thereon. The computer readable media may be transitory or non-transitory. The modules can communicate by way of local or remote processes such as in accordance with a signal having one or more data packets (e.g. data from one component interacting with another component in a local system, distributed system, or across a network with other systems by way of the signal.

Those skilled in the art will appreciate that the various illustrative logical blocks, modules, circuits, methods, and algorithms described in connection with the examples disclosed herein may be implemented as electronic hardware, computer software, or combinations of both. To clearly illustrate this interchangeability of hardware and software, various illustrative components, blocks, modules, circuits, methods, and algorithms have been described above generally in terms of their functionality. Whether such functionality is implemented as hardware or software depends upon the particular application and design constraints imposed on the overall system. Implementations in software may be effected using conventional programming languages using code that achieves the requirements of the foregoing specification.

Exemplary embodiments of the invention have been disclosed in an illustrative style, and accordingly, the terminology employed throughout should be read in an exemplary rather than a limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A process executed on a processor circuit for fitting construction materials to an architectural surface representation stored in a computer-aided design (CAD) file residing at a memory circuit, the process comprising:
    dividing the surface representation into a plurality of domains;
    for each domain in the plurality of domains:
        (i) defining multiple sample points that lie on a surface of the domain;
        (ii) matching a surface of a regular curved solid to the multiple sample points using a low accuracy match and a high accuracy match, the low accuracy match determining type and orientation for the regular curved solid, wherein the type and orientation are determined by:
            locating a test solid at a test orientation with respect to the sample points so that at least two of the sample points coincide with a surface of the test solid;
            calculating minimum displacements of non-coinciding sample points from the surface of the test solid;
            comparing the minimum displacements to a low accuracy tolerance;
            adjusting, responsive to at least one of the minimum displacements exceeding the tolerance, one or both of the test orientation and the test solid type; and
            repeating the calculating and comparing steps until the regular curved solid is determined for which none of the minimum displacements exceeds the tolerance;
        (iii) defining the domain as a surface portion of the regular curved solid in terms of a central reference and boundary conditions; and
        (iv) comparing the terms of the defined domain to specifications for construction materials to identify which construction materials can form the domain; and
    identifying at least one construction material that can form every domain in the plurality of domains.

2. The process of claim 1 wherein each domain includes data identifying a location within the surface representation.

3. The process of claim 1 wherein, responsive to at least one of the minimum displacements exceeding the tolerance after exhausting all adjustments, dividing the domain into multiple subdomains and repeating the matching step for each subdomain.

4. A process executed on a processor circuit for fitting construction materials to an architectural surface representation stored in a computer-aided design (CAD) file residing at a memory circuit, the process comprising:
    dividing the surface representation into a plurality of domains;
    for each domain in the plurality of domains:
        (i) defining multiple sample points that lie on a surface of the domain;
        (ii) matching a surface of a regular curved solid to the multiple sample points using a low accuracy match and a high accuracy match, the low accuracy match determining type and orientation for the regular curved solid, wherein the high accuracy match comprises:
            (a) selecting multiple triplets from among the multiple sample points, each triplet consisting of any three of the sample points;
            (b) defining vectors for each triplet, each vector originating from one of the three sample points and extending to another of the three sample points;
            (c) for every two vectors that have a common origin, calculating a resultant vector as a cross product of the two vectors to yield multiple resultant vectors;
            (d) for every pair of the resultant vectors, determining a reference point at which distance between the pair is minimum, thereby determining multiple reference points; and
            (e) approximating the central reference for the regular curved solid based on the multiple reference points;
        (iii) defining the domain as a surface portion of the regular curved solid in terms of a central reference and boundary conditions; and
        (iv) comparing the terms of the defined domain to specifications for construction materials to identify which construction materials can form the domain; and
    identifying at least one construction material that can form every domain in the plurality of domains.

5. The process of claim 4 wherein the central reference is selected from the group consisting of an axis and an origin.

6. The process of claim 5 wherein a location of the central reference is approximated using regression analysis.

7. The process of claim 4 wherein the high accuracy match further comprises:
    (f) defining a test surface from the type of regular curved solid determined by the low accuracy match having an axis defined by the high accuracy match and having boundary conditions of the domain;
    (g) calculating minimum displacements of the sample points from the test surface;
    (h) comparing the minimum displacements to a high accuracy tolerance;
    (i) if at least one of the minimum displacements exceeds the tolerance, adjusting a geometric parameter of the test surface to create a new test surface and repeating steps (g) through (i) until all of the minimum displacements are within the tolerance.

8. The process of claim 7 wherein the geometric parameter comprises a radius.

9. A computer system for selecting construction materials for an architectural surface representation defined in a computer-aided design (CAD) file, comprising:
    a processor;
    a computer readable medium storing executable code that when executed by the processor performs the following process steps:
    dividing the surface representation into a plurality of domains;
    for each domain in the plurality of domains:
        (i) defining multiple sample points that lie on a surface of the domain;
        (ii) matching a surface of a regular curved solid to the multiple sample points by:
            locating a test solid at a test orientation with respect to the sample points so that at least two of the sample points coincide with a surface of the test solid;
            calculating minimum displacements of non-coinciding sample points from the surface of the test solid
            comparing the minimum displacements to a first tolerance;

adjusting, responsive to at least one of the minimum displacements exceeding the first tolerance, one or both of the test orientation and type of the test solid; and repeating the calculating and comparing steps until the regular curved solid is determined for which none of the minimum displacements exceeds the first tolerance;

(iii) defining the domain as a portion of the regular curved solid surface in terms of a center and boundary conditions; and (iv) comparing the terms of the defined domain to specifications for construction materials to identify which construction materials can form the domain; and identifying at least one construction material that can form every domain in the plurality of domains.

10. The system of claim 9 wherein, responsive to at least one of the minimum displacements exceeding the first tolerance after exhausting all adjustments, dividing the domain into multiple subdomains and repeating the matching step for each subdomain.

11. A computer system for selecting construction materials for an architectural surface representation defined in a computer-aided design (CAD) file, comprising:

a processor;
a computer readable medium storing executable code that when executed by the processor performs the following process steps:
dividing the surface representation into a plurality of domains;
for each domain in the plurality of domains:
(i) defining multiple sample points that lie on a surface of the domain;
(ii) matching a surface of a regular curved solid to the multiple sample points, wherein the matching step comprises:
(a) selecting multiple triplets from among the multiple sample points, each triplet consisting of any three of the sample points;
(b) defining vectors for each triplet, each vector originating from one of the three sample points and extending to another of the three sample points;
(c) for every two vectors that have a common origin, calculating a resultant vector as a cross product of the two vectors to yield multiple resultant vectors;
(d) for every pair of the resultant vectors, determining a point at which distance between the pair is minimum, thereby determining multiple points;
(e) approximating the center for the regular curved solid based on the multiple points;
(iii) defining the domain as a portion of the regular curved solid surface in terms of a center and boundary conditions; and
(iv) comparing the terms of the defined domain to specifications for construction materials to identify which construction materials can form the domain; and
identifying at least one construction material that can form every domain in the plurality of domains.

12. The system of claim 11 further comprising:
(f) defining a test surface having the approximated center and having boundary conditions of the domain;
(g) calculating minimum displacements of the sample points from the test surface;
(h) comparing the minimum displacements to a second tolerance;
(i) if at least one of the minimum displacements exceeds the second tolerance, adjusting a geometric parameter of the test surface to create a new test surface and repeating steps (g) through (i) until all of the minimum displacements are within the second tolerance.

13. A non-transitory computer readable medium having instructions encoded thereon as a series of process steps that, when executed by a processor, determine construction materials for an architectural surface representation defined in a computer-aided design (CAD) file, the steps comprising:

defining multiple sample points that lie on the surface representation;
matching a surface of a regular curved solid to the multiple sample points using a low accuracy match to determine type and orientation for the regular curved solid and a high accuracy match for determining a center location for the regular curved solid, wherein the high accuracy match comprises:
(a) selecting multiple triplets from among the multiple sample points, each triplet consisting of any three of the sample points;
(b) defining vectors for each triplet, each vector originating from one of the three sample points and extending to another of the three sample points;
(c) for every two vectors that have a common origin, calculating a resultant vector as a cross product of the two vectors to yield multiple resultant vectors;
(d) for every pair of the resultant vectors, determining a point at which distance between the pair is minimum, thereby determining multiple points;
(e) approximating the center for the regular curved solid based on the multiple points;
defining the surface representation as a portion of the regular curved solid surface in terms of a center and boundary conditions;
comparing the terms of the defined surface representation to electronically stored specifications for construction materials to identify at least one construction material that can form the surface representation.

14. The non-transitory computer readable medium of claim 13 wherein the low accuracy match comprises:
locating a test solid at a test orientation with respect to the sample points so that at least two of the sample points coincide with a surface of the test solid;
calculating minimum displacements of non-coinciding sample points from the surface of the test solid;
comparing the minimum displacements to a first tolerance;
adjusting, responsive to at least one of the minimum displacements exceeding the first tolerance, one or both of the test orientation and type of the test solid; and
repeating the calculating and comparing steps until a regular curved solid is determined for which none of the minimum displacements exceeds the first tolerance.

15. The non-transitory computer readable medium of claim 13 further comprising:
(f) defining a test surface as a surface portion of the regular curved solid placed at the approximated center, the surface portion having an area limited by the boundary conditions of the surface representation;
(g) calculating minimum displacements of the sample points from the test surface;
(h) comparing the minimum displacements to a second tolerance;
(i) if at least one of the minimum displacements exceeds the second tolerance, adjusting a geometric parameter of the test surface to create a new test surface and repeating steps (g) through (i) until all of the minimum displacements are within the second tolerance.

* * * * *